(12) United States Patent
Tseng et al.

(10) Patent No.: US 12,721,220 B2
(45) Date of Patent: Aug. 25, 2026

(54) METHODS OF FORMING PACKAGES AND RESULTING STRUCTURES

(71) Applicant: Taiwan Semiconductor Manufacturing Co., Ltd., Hsinchu (TW)

(72) Inventors: Chien-Fu Tseng, Taipei City (TW); Yu Chieh Yung, Hsinchu (TW); Cheng-Hsien Hsieh, Kaohsiung City (TW); Hung-Pin Chang, New Taipei City (TW); Li-Han Hsu, Hsinchu (TW); Wei-Cheng Wu, Hsinchu (TW); Der-Chyang Yeh, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 702 days.

(21) Appl. No.: 18/151,758

(22) Filed: Jan. 9, 2023

(65) Prior Publication Data

US 2023/0402429 A1 Dec. 14, 2023

Related U.S. Application Data

(60) Provisional application No. 63/379,865, filed on Oct. 17, 2022, provisional application No. 63/366,261, filed on Jun. 13, 2022.

(51) Int. Cl.

| | |
|---|---|
| ***H10W 70/09*** | (2026.01) |
| ***H10W 20/20*** | (2026.01) |
| ***H10W 70/05*** | (2026.01) |
| ***H10W 70/60*** | (2026.01) |
| ***H10W 70/685*** | (2026.01) |

(Continued)

(52) U.S. Cl.
CPC ........... *H10W 90/00* (2026.01); *H10W 20/20* (2026.01); *H10W 70/095* (2026.01); *H10W 70/611* (2026.01); *H10W 70/685* (2026.01); *H10W 90/401* (2026.01); *H10W 70/09* (2026.01); *H10W 70/6528* (2026.01); *H10W 72/942* (2026.01); *H10W 74/15* (2026.01); *H10W 90/724* (2026.01); *H10W 90/734* (2026.01)

(58) Field of Classification Search
CPC ................ H01L 21/486; H01L 23/481; H01L 23/49833; H01L 23/5383; H01L 24/19
See application file for complete search history.

(56) References Cited

U.S. PATENT DOCUMENTS

| | | | |
|---|---|---|---|
| 9,000,584 | B2 | 4/2015 | Lin et al. |
| 9,048,222 | B2 | 6/2015 | Hung et al. |

(Continued)

FOREIGN PATENT DOCUMENTS

| | | | |
|---|---|---|---|
| TW | 201803039 | A | 1/2018 |
| TW | 202036690 | A | 10/2020 |

*Primary Examiner* — Trang Q Tran
(74) *Attorney, Agent, or Firm* — Slater Matsil, LLP

(57) ABSTRACT

Manufacturing flexibility and efficiency are obtained with a method, and resulting structure, in which RDL contact features can be formed and aligned to through silicon vias (TSV's) regardless of any potential mismatch in the respective critical dimensions (CD's) between the manufacturing process for forming the TSV's and the manufacturing process for forming the contact features. Various processes for a self-aligned exposure of the underlying TSV's, without the need for additional photolithography steps are provided.

20 Claims, 17 Drawing Sheets

(51) Int. Cl.

| | |
|---|---|
| ***H10W 90/00*** | (2026.01) |
| *H10W 70/652* | (2026.01) |
| *H10W 72/90* | (2026.01) |
| *H10W 74/15* | (2026.01) |

(56) References Cited

U.S. PATENT DOCUMENTS

| | | | |
|---|---|---|---|
| 9,048,233 | B2 | 6/2015 | Wu et al. |
| 9,064,879 | B2 | 6/2015 | Hung et al. |
| 9,111,949 | B2 | 8/2015 | Yu et al. |
| 9,263,511 | B2 | 2/2016 | Yu et al. |
| 9,281,254 | B2 | 3/2016 | Yu et al. |
| 9,368,460 | B2 | 6/2016 | Yu et al. |
| 9,372,206 | B2 | 6/2016 | Wu et al. |
| 9,496,189 | B2 | 11/2016 | Yu et al. |
| 9,530,738 | B2 | 12/2016 | Chua et al. |
| 11,476,188 | B2 * | 10/2022 | McKnight-MacNeil .................... H01L 21/76802 |
| 11,476,219 | B2 | 10/2022 | Chang et al. |
| 2012/0313247 | A1 | 12/2012 | Yu et al. |
| 2018/0005916 | A1 | 1/2018 | Chen et al. |
| 2019/0006264 | A1 * | 1/2019 | Vaidya .................... H01L 24/06 |
| 2021/0098423 | A1 * | 4/2021 | Chen ..................... H01L 25/105 |
| 2021/0407962 | A1 * | 12/2021 | Kim .................... H01L 23/5385 |
| 2023/0061189 | A1 * | 3/2023 | Lo ........................... H01L 25/50 |

* cited by examiner 7
6
2
6
7
22
4

7
6
2
24
6
24
7
22
4

7
6
2
6
7
22
4

7
22
6
2
6
7
4

22
7
6
2
6
7
4

9
9
9
9
9
7
6
2
6
7
30
22
4

METHODS OF FORMING PACKAGES AND RESULTING STRUCTURES

PRIORITY CLAIM AND CROSS-REFERENCE

This application is a conversion of and claims priority to U.S. Provisional Patent Application No. 63/366,261, filed on Jun. 13, 2022, entitled "InFO TSV Reveal Process," and claims priority to U.S. Provisional Patent Application No. 63/379,865, filed on Oct. 17, 2022, entitled "Methods of Forming Packages and Resulting Structures," which applications are incorporated herein by reference.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged. An example of such packaging systems is Package-on-Package (PoP) technology. In a PoP device, a top semiconductor package is stacked on top of a bottom semiconductor package to provide a high level of integration and component density. PoP technology generally enables production of semiconductor devices with enhanced functionalities and small footprints on a printed circuit board (PCB).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION OF ILLUSTRATIVE EMBODIMENTS

Figure 1A:
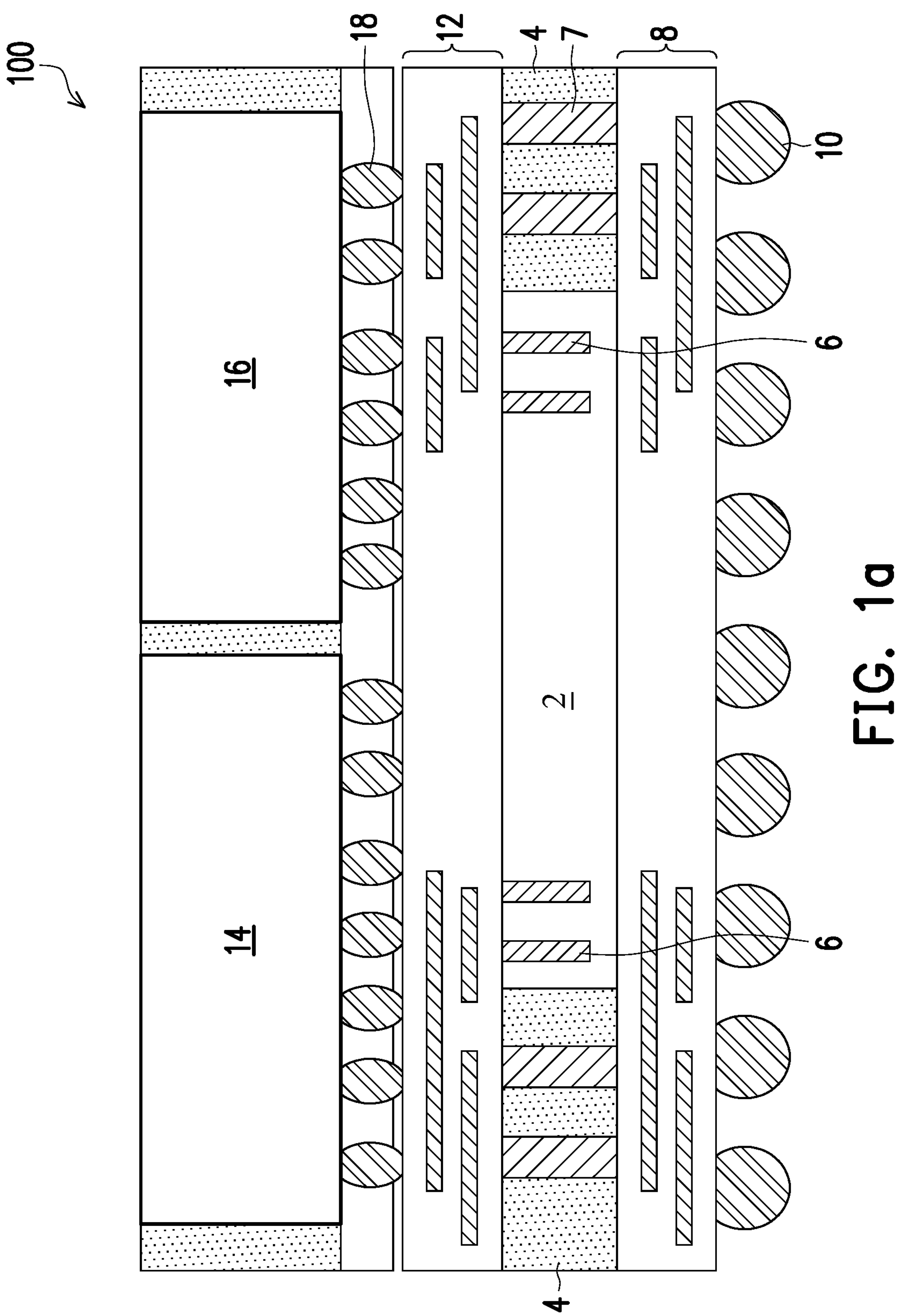
FIGS. 1*a* and 1*c*, respectively illustrates a cross-sectional view of a semiconductor package in which embodiments of the present disclosure may be incorporated.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 illustrates an exemplary Integrated Fan-Out (InFO) package 100 in which semiconductor die, e.g. 14, 16, can be stacked in what is sometimes called a 3D stacking arrangement. In more detail, package 100 also includes a die 2, including a silicon substrate 2*a* having one or more conductive vias 6 formed therein, that is at least partially embedded within a molding compound 4. In the illustrated embodiment, die 2 is encased within molding compound 4 around its four sides. In some embodiments, the top surface of the die 2 is free of molding compound 4. In some embodiments, the bottom surface of die 2 is free of molding compound 4. Other configurations are within the contemplated scope of this disclosure and will be apparent to those skilled in the art. As mentioned, substrate 2*a* is typically formed of crystalline silicon. Molding compound 4 is typically formed of a commercially available molding compound and is typically an elastomer or rubber material, a resin material, a composite material, a thermoplastic or thermosetting polymer, silicone, or the like, as is known in the art.

As illustrated, die 2 is typically a non-active or blank substrate, free of electrical circuitry formed thereon, with the exception of conductive vias 6. The conductive via 6 is formed to pass through at least portion of the substrate 2*a*. In some embodiments, the conductive via 6 is referred to a through via, a through silicon via (TSV). In some embodiments, the substrate 2*a* is formed of silicon, and the conductive via 6 is referred to a through silicon via (TSV). In other contemplated embodiments, die 2 could include active or passive components (not illustrated) or could even include an integrated circuit (not shown) formed thereon. Similarly, in the illustrated embodiment conductive vias 7 are formed in the molding compound 4. In some embodiments, the conductive via 7 extends through the molding compound 4 and is referred to herein as a through mold via (TMV). The TMV 7 provides additional configurability and interconnectability to package 100. In some embodiments, the TMVs 7 are not necessary for operation and use of the disclosed embodiment.

As further illustrated in FIG. 1, die 2 and molding compound 4 are formed atop (in the orientation illustrated) a re-distribution layer (RDL) 8. By the phrase "formed thereon" it should not be interpreted to mean that RDL 8 is formed first and then die 2 and molding compound 4 are formed or placed atop RDL 8—although such an order is within the contemplated scope of this disclosure. Equally within the scope of this disclosure is a methodology in which die 2 is at least partially encapsulated within molding compound 4 (at least, for instance around its four sides) and then RDL 8 is formed on molding compound 4 and die 2—in which case package 100 would likely be oriented flipped (with RDL 8 on top) relative to the orientation of FIG. 1, at least during the process steps of forming RDL 8. As is known, RDL 8 includes one or more respective layers of conductive features embedded within respective layers of dielectric material; the respective layers of conductive features also being interconnected through respective conductive vias extending (vertically) between the respective layers of conductive features. Two layers of conductive features and one vertical conductive via is illustrated in FIG. 1—although this is a simplified drawing for explanation only; one skilled in the art will recognize many conductive layers and conductive vias, embedded in many respective dielectric layers, will likely be involved in most practical applications of the embodiments disclosed herein. Connectors 10 electrically connect RDL 8 to another component (not illustrated) such as a printed circuit board (PCB), a flexible circuit board, another substrate, or the like. Connectors 10 could be formed of solder balls, solder bumps, controlled collapse chip connection (aka C4) connectors, or the like. In other embodiments, connectors 102 could be formed of copper or other metallic pillars or wires.

A second RDL 12 is illustrated on the opposite side of die 2 and molding compound 4, in the orientation shown. This second RDL 12 could be formed of the same materials in the same manner as is formed RDL 8, although alternatively second RDL 12 could be formed differently using a different number of conductive layers and dielectric layer, etc., provided that second RDL 12 performs the function of electrically interconnecting components above RDL 12 (in the illustrated case, integrated circuit 14 and integrated circuit 16) to each other, through connectors 18, and/or to components below RDL 12 (in the illustrated case, die 2 and/or RDL 8 and/or another component (not illustrated) through connectors 10. In illustrative embodiments, integrated circuits 14 and 16 are respective active chips, such as logic chips, application processors, and the like—although other types of integrated circuits are within the contemplated scope of this disclosure.

While not specifically illustrated in FIG. 1, one skilled in the art will recognize that RDL 12 will have contact pads, sometimes referred to herein as contact features that must align with and electrically and physically contact TSV's 6 in order to electrically interconnect RDL 12 and die 2, or whatever other component(s) that TSV's 6 are electrically coupled to (whether directly or indirectly). Likewise, RDL 8 will have contact features that also align with and electrically and physically contact (the other end of) TSV's 6 in order to electrically interconnect RDL 8 with those components that TSV's 6 are electrically coupled to (such as, for instance, integrated circuit 14 and/or integrated circuit 16). Similarly, for those embodiments having TMV's 7, RDL 12 and RDL 8 would have further contact features aligned with and electrically and physically contacting the respective TMV's 8.

Note that RDL 12 has a larger "footprint" than does integrated circuit 14 and integrated circuit 16 and, in fact, has a larger "footprint" than does die 2. In this way, RDL 12 can "fan out" the electrical connection points available for connectors 10 and for connectors 18 relative to integrated circuit 14, integrated circuit 16, and die 2, respectively. Hence, on skilled in the art will recognize that FIG. 1 illustrates a simplified 3D stacked InFo package. Numerous variations and additions to the illustrated embodiment, including more than two integrated circuits, stacked integrated circuits, additional substrates, stacked substrates, stacked RDL's, and the like, all of which are within the contemplated scope of the present disclosure.

Figure 7A:
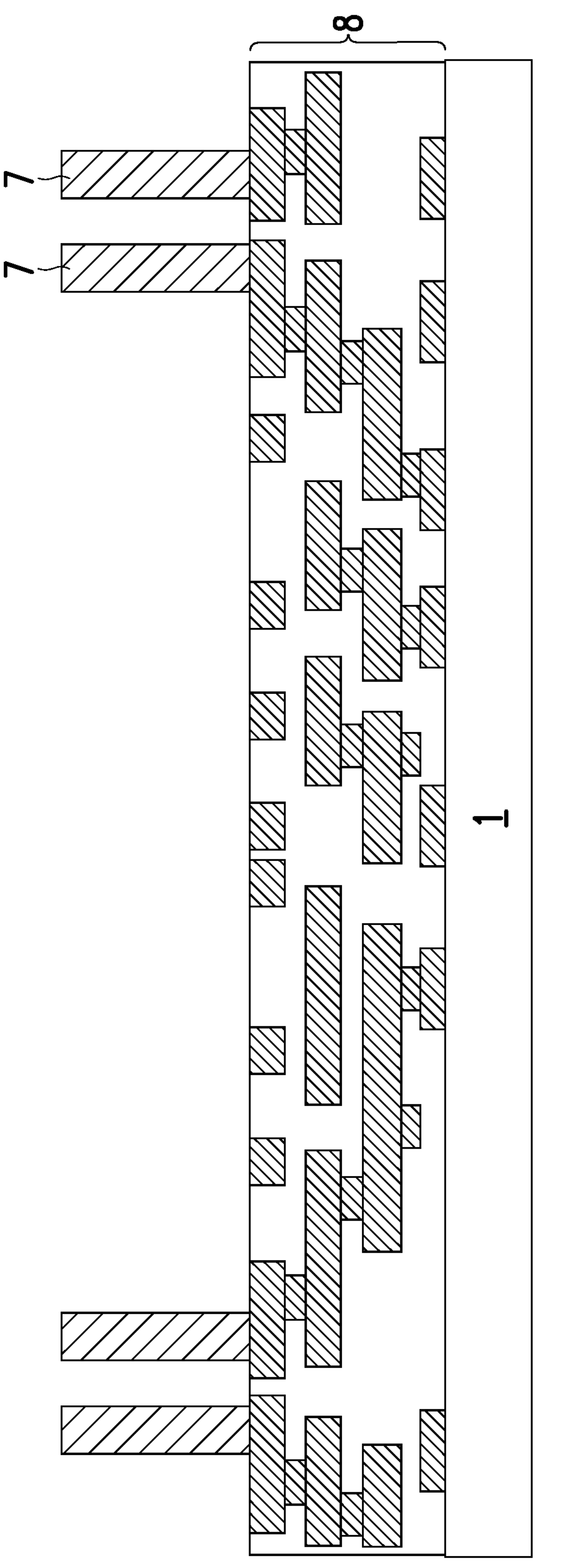
FIGS. 7*a* through 7*e* collectively illustrate major steps in a process for forming a packaged device in accordance with various embodiments disclosed here.
Figure 7B:
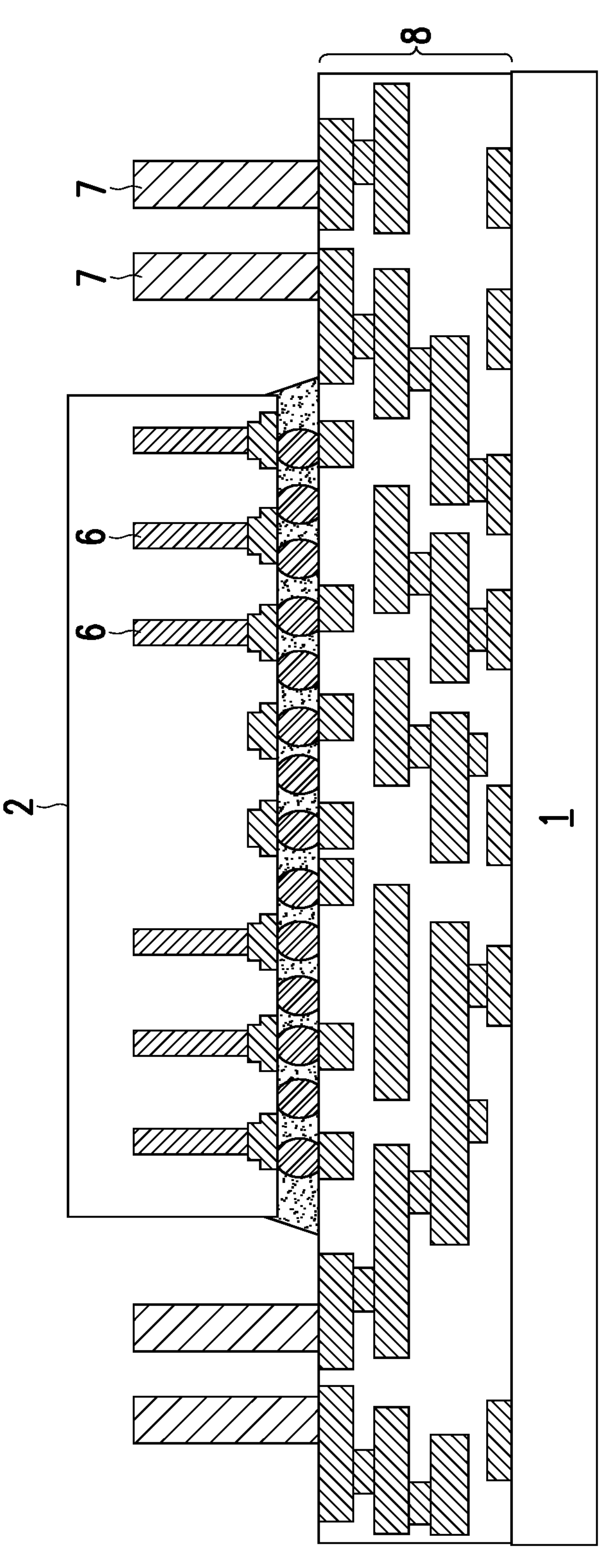
Figure 7C:
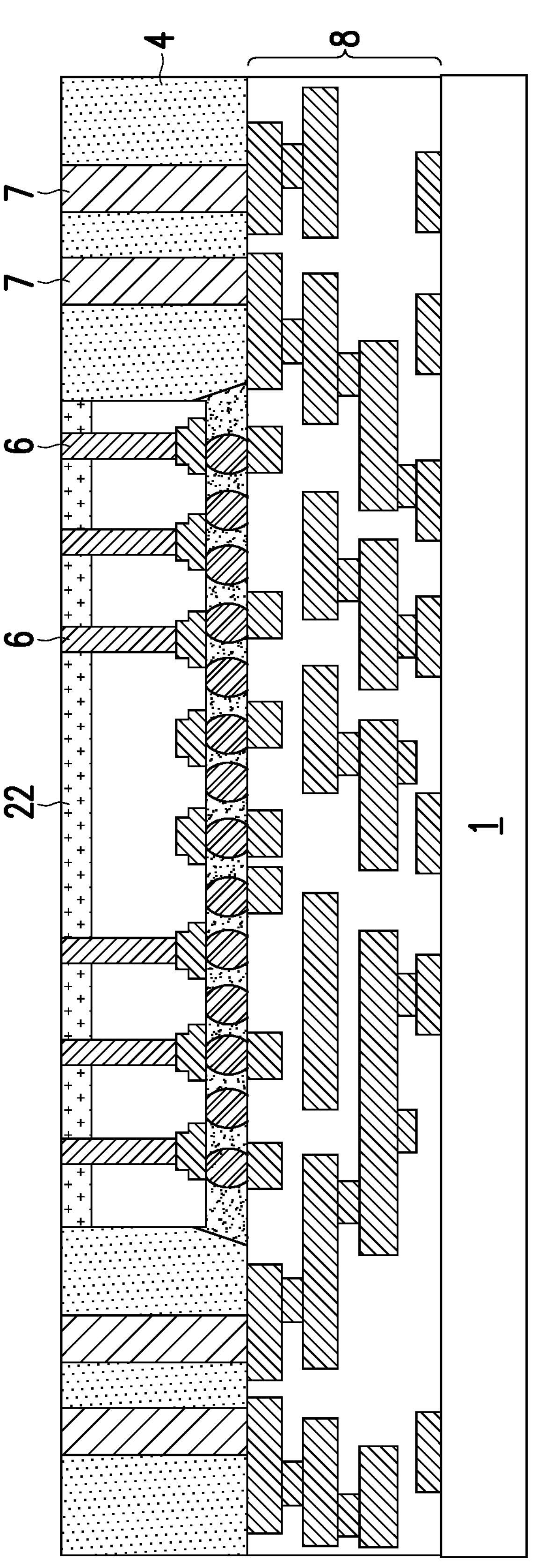

Before describing further the embodiment illustrated in FIG. 1*a*, attention is now directed to FIGS. 7*a* through 7*e*, which illustrate major steps in an exemplary process flow of forming an InFO package. Starting with FIG. 7*a*, in this example, RDL 8 is formed on carrier 1 and TMVs 7 are formed electrically connected to appropriate contacts pads of a topmost (for the orientation illustrated) metal level of RDL 8. As next illustrated in FIG. 7*b*, die 2 is likewise mounted on and electrically connected to RDL 8. As shown, die 2 has TSVs 6 extending at least partially therethrough. Following on with FIG. 7*c*, die is subjected to a backside grind or other process whereby TSVs 6 become exposed at the back side of die 2. This process can occur after die 2 is attached to RDL 8, as illustrated, or can occur before die 2 is attached to RDL 8 in other embodiments. Also shown in FIG. 7*c* is molding compound 4, which is formed to encapsulate die 2 and also TMVs 7. Passivation layer 22 is also shown in FIG. 7*c* on the backside of die 2 and being patterned to expose TSVs 6, which will be explained in greater detail below.

Figure 7D:
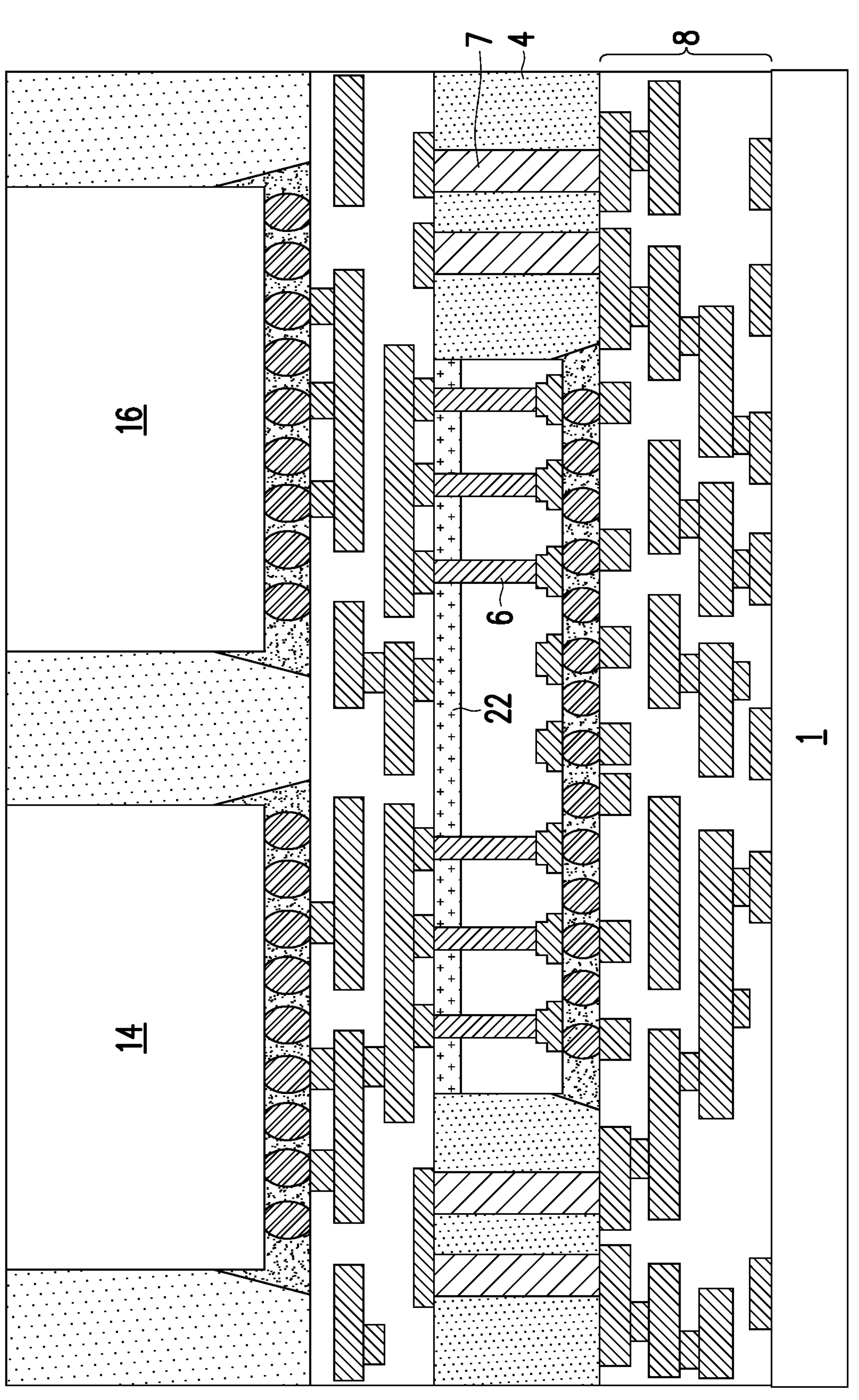
Figure 7E:
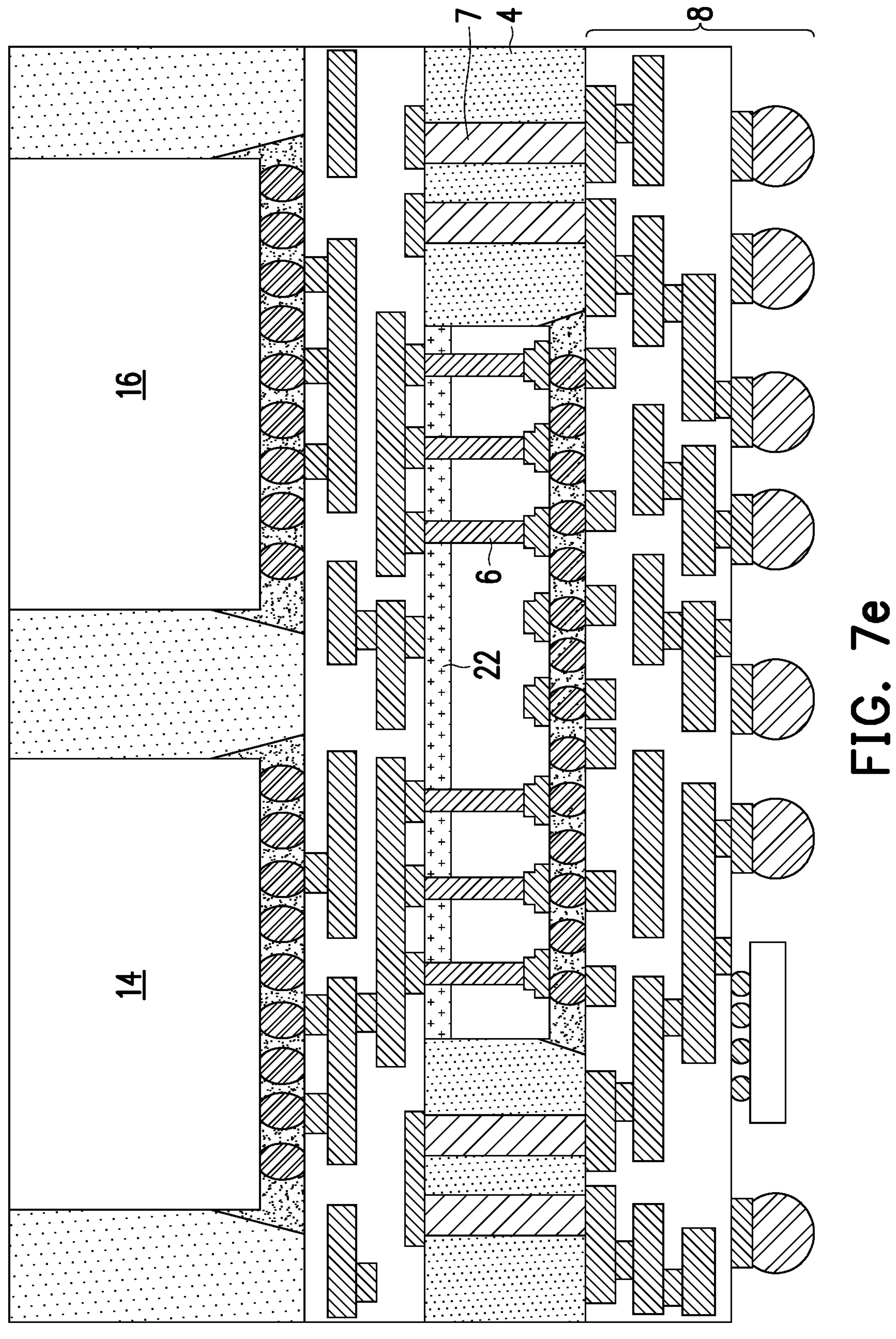

Continuing on with FIG. 7*d*, second RDL 12 is formed over and electrically connected to die 2 (through TSVs 6) and to TMVs 7, as was described above. Next, dies 14 and 16 are formed on and electrically connected to the opposite side (relative die 2) of RDL 12. Die 14 and 16 can likewise be encapsulated in a molding compound 9, as shown. Lastly, as illustrated in FIG. 7*e*, carrier 1 can be removed to complete the illustrated process steps.

Figure 1B:
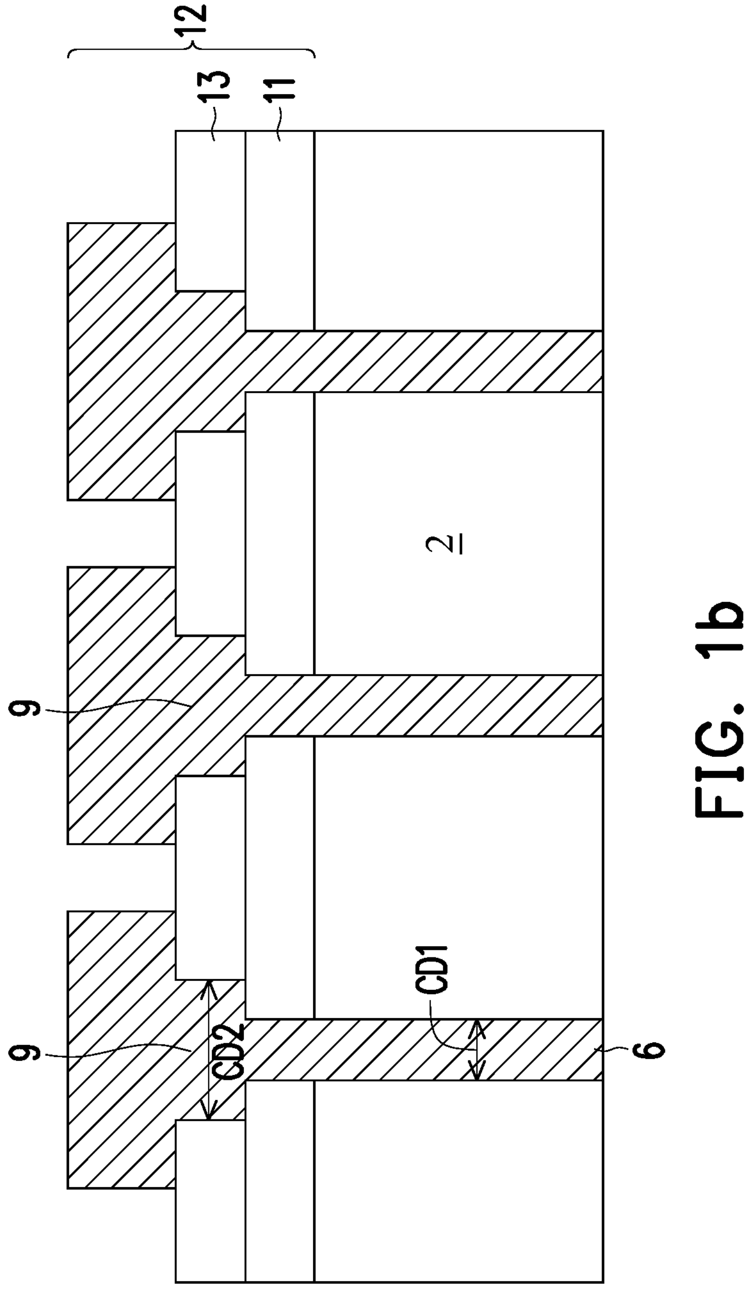
FIG. 1*b* illustrates in greater detail a portion of the package of FIG. 1*a*.

In embodiments, exemplary package 100 includes a die 2 having a first critical dimension (CD) limitation for the minimum size of TSV's 6 and exemplary package 100 further includes an RDL 12 having a second CD limitation for the minimum size of its contact features. In this instance accommodation must be made to compensate for the different CD's. In some embodiments, it may be particularly advantageous to compensate for such different CD's without the need for employing additional passivation layers in the manufacturing process. FIG. 1*b* illustrates such an example, wherein die 2 is manufactured using a process that allows for the formation of TSV's 6 having a minimum width/feature size CD1, as shown, whereas the minimum width/feature size for the contact feature 9 of RDL 12 is CD2—which in the illustrated embodiment is larger than CD1 (CD2>CD1). Under these circumstances, it may be necessary to include a separate, more patternable passivation layer 11 that can accommodate the smaller critical dimension CD1 intermediate die 2/TSV's 6 and bottommost dielectric layer 13 of RDL 12, which cannot accommodate the smaller critical dimension CD1. The approach illustrated in FIG. 1*b*, however, requires forming and patterning an additional layer, which increases the manufacturing costs and complexity.

Figure 1C:
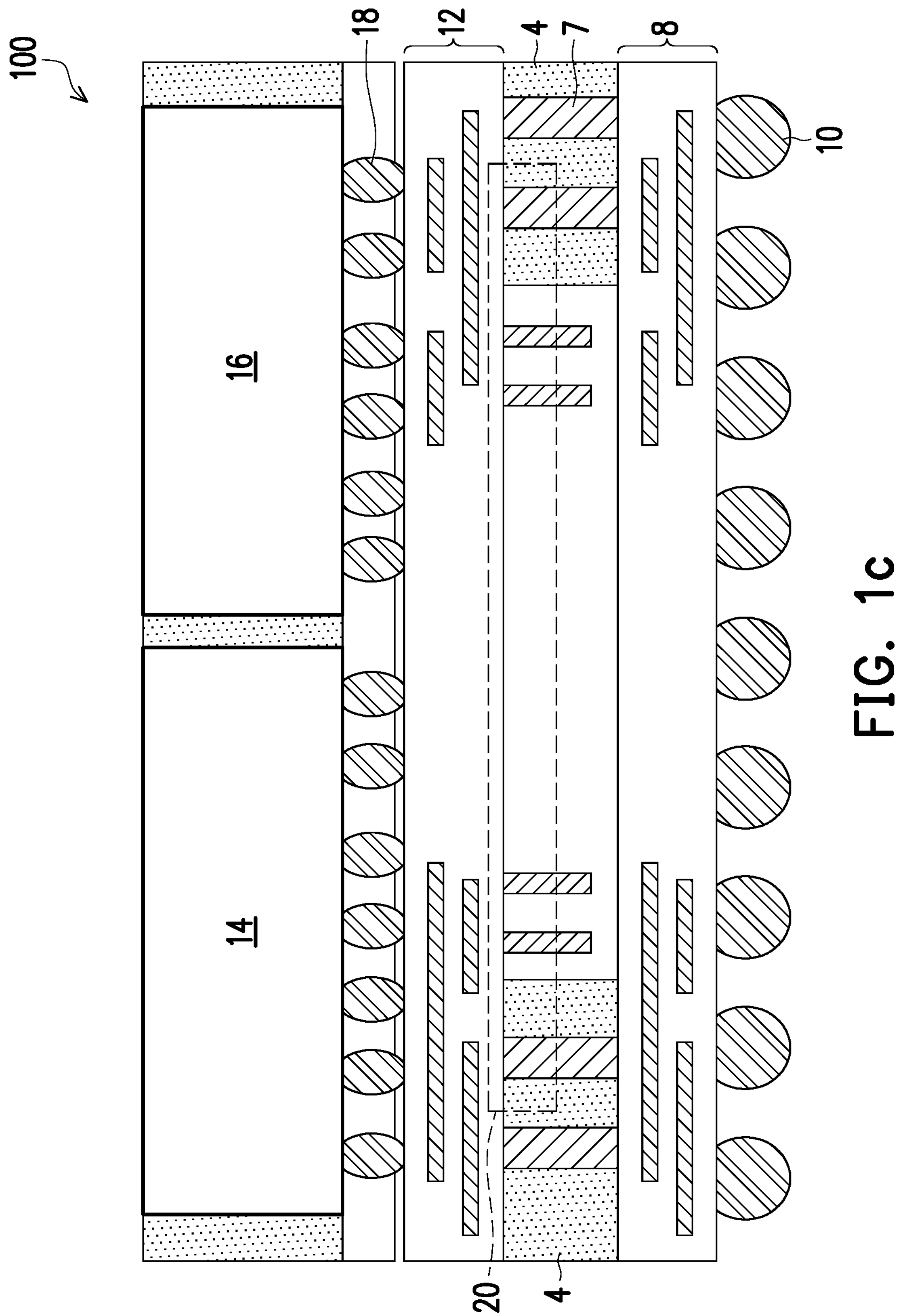
Figures 2A, 2B:
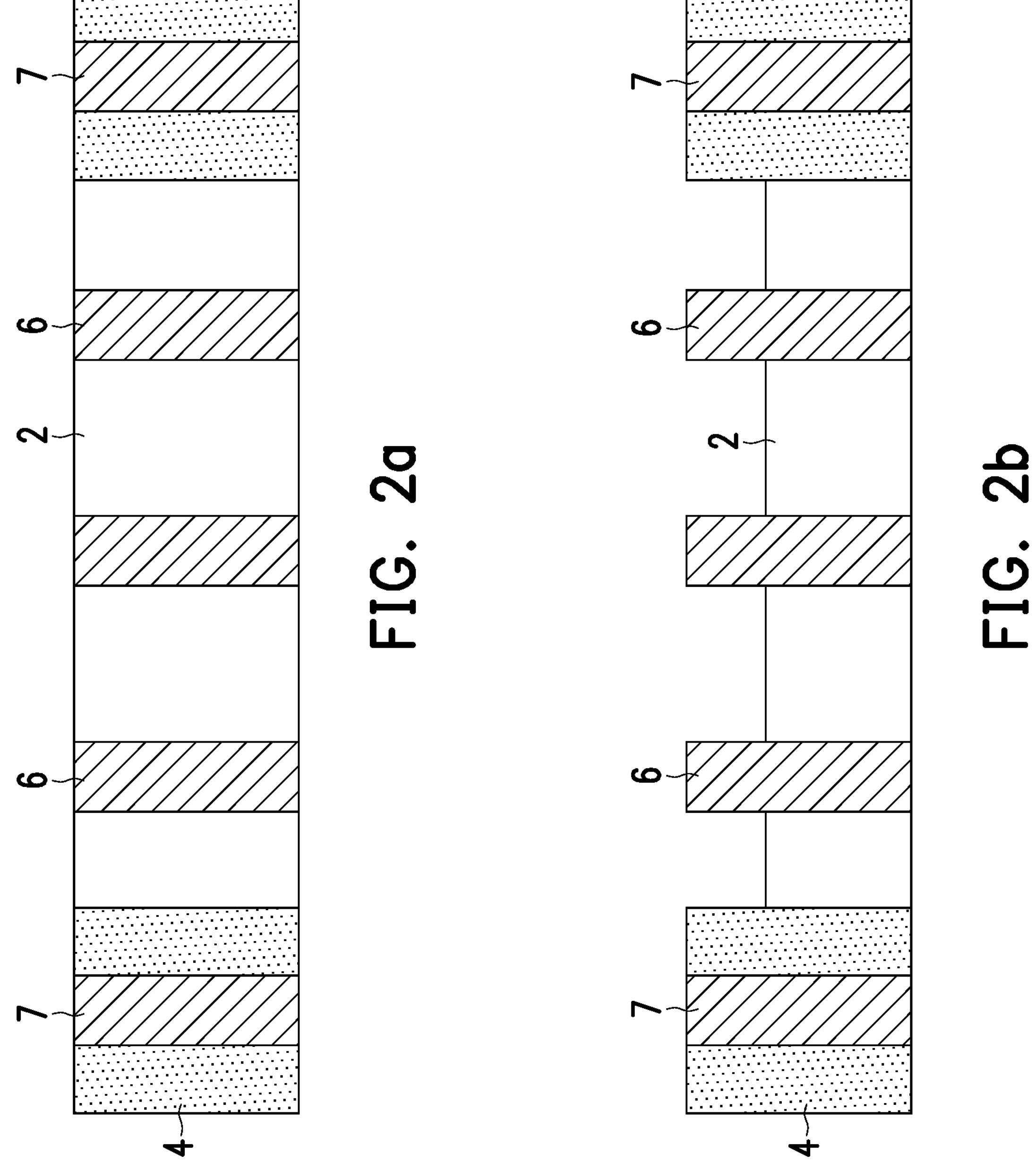
FIGS. 2*a* through 2*e* illustrate cross-sectional views of various intermediate stages of manufacture of a semiconductor package in accordance with some embodiments.

A preferable approach to forming package 100 will be described now with respect to FIG. 1*c* and FIGS. 2*a*-through 2*e*, wherein each of FIGS. 2*a* through 2*e* illustrate at various intermediate stages of the manufacture the portion of package 100 illustrated in FIG. 1*c* by dotted line box 20. As dotted line box 20 (FIG. 1*c*) shows, the relevant portion of package 100 illustrated in FIGS. 2*a* through 2*e* is the top surface of die 2, and the TSV's 6 embedded therein, as well as the top surface of surrounding molding compound 4 and the TMVs 7, if any, embedded therein.

FIG. 2*a* schematically illustrates a first one of the illustrated intermediate stages, wherein molding compound 4 has been formed around the sides of die 2 and the respective topmost surfaces of molding compound 4 and die 2 have been planarized. Furthermore, in the intermediate stage of manufacture illustrated in FIG. 2*a*, TSV's 6 have already been formed extending through die 2 and respective topmost surfaces of TSV's 6 have been planarized to the topmost surface of die 2. Likewise, in the illustrated embodiment in which TMV's 7 are formed, TMV's 7 have already been formed extending through molding compound 4 and respective topmost surface of TMV's 7 and the topmost surface of molding compound 4 have been planarized as well. The specific steps of forming die 2, molding compound 4, TSV's 6, and TMV's 8 are not necessary for understanding the scope of the presently described embodiments. Suffice to say that one skilled in the art will recognize various materials and processes for forming the intermediate structure of package 100 shown in FIG. 2*a* through routine experimentation once informed by the present disclosure.

FIG. 2*b* illustrates package 100 in a next intermediate stage of production, one after the top surface of die 2 has been recessed, thus leaving TSV's 6 extending above the recessed top surface of die 2. As shown in FIG. 2*b*, molding compound 4 is not substantially removed or recessed during the process, the end-result of which is shown in FIG. 2*b*, meaning that after the process the top surface of molding compound 4 as well as the top surface of TMV's 7 remains substantially un-recessed. Of course, as will be recognized, some portion of the respective top surfaces of TSV's 6, molding compound 4, and TMV's 7 may be removed or slightly recessed during this process—but such slight recessing is unintentional and simply an unintended or unavoidable consequence of less-than-ideal process conditions.

In one example, die 2 is recessed using a selective etch process that attacks, or removes, the exposed silicon surface while leaving the exposed surfaces of molding compound 4, TSV's 6, and TMV's 7 relatively unscathed. By way of example, and not by way of limitation or exhaustion, one embodiment process for recessing the top surface of die 2, when die 2 has a silicon substrate 2*a*, is a deep reactive ion etch ("DRIE) process, which process is highly selective to silicon relative to copper. An exemplary DRIE process consists of a three-step cycle: passivation film deposition, removing portions of the passivation film, and silicon etching exposed portions of the silicon. For instance, $C_4F_8$ can be reacted to form a polymer film on the substrate, and a species such as SF6 can be used for etching the silicon. Such a process, as an example, will recess silicon substrate 2*a* of die 2 without substantially attacking TSV's 6.

Figures 2C, 2D:
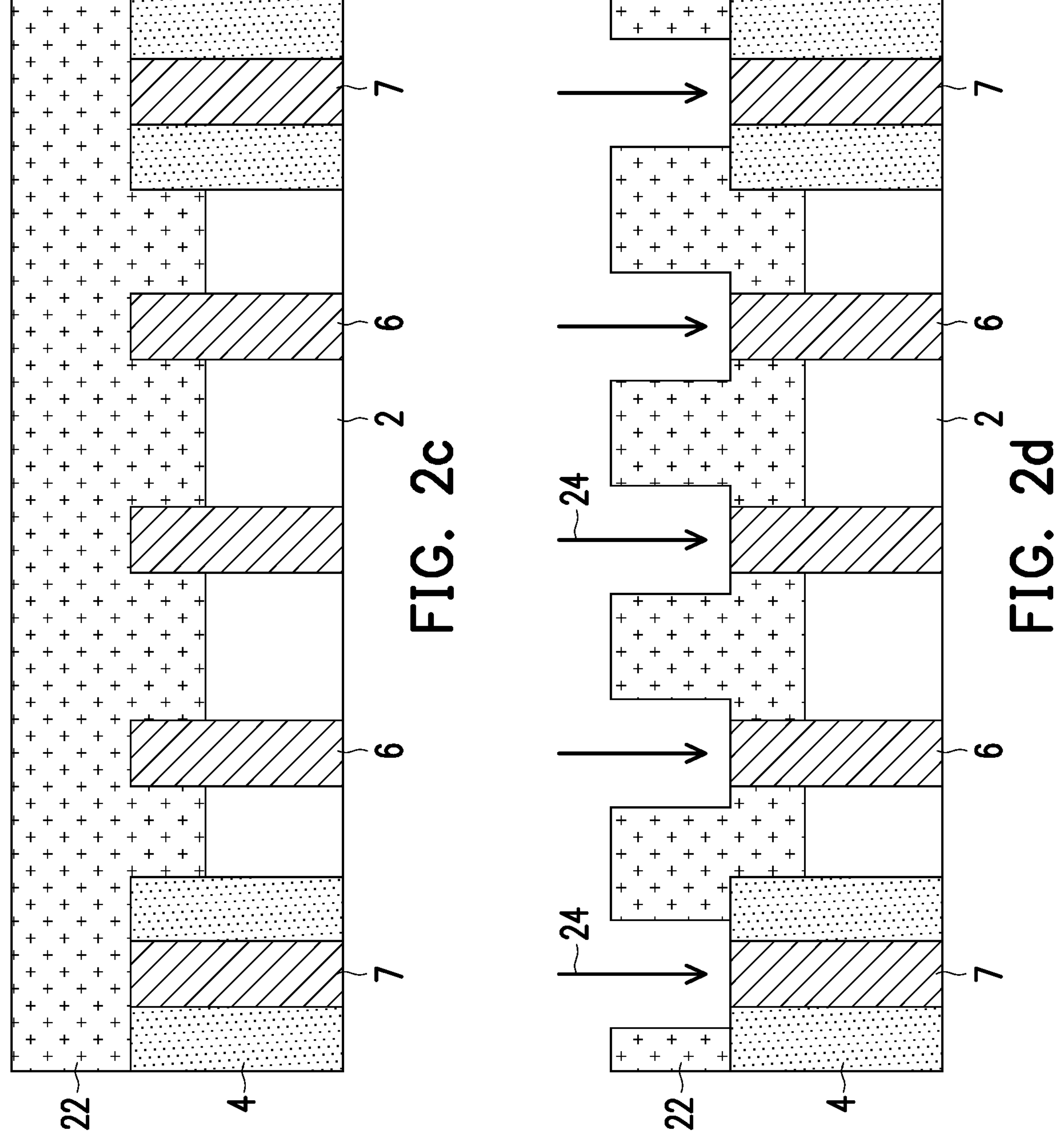

Continuing on with FIG. 2*c*, a photo-sensitive passivation layer 22 is formed over the top surfaces of die 2, TSV's 6, molding compound 4, and TMV's 7. In some embodiments, passivation layer 22 is formed of a dielectric polymer, more particularly a low temperature polyimide (LTPI), although or other materials that are conventionally employed for forming a dielectric layer or layers of RDL 12—particularly as passivation layer 22 will serve as the first dielectric layer of RDL 12, as more fully described below. In other words, passivation layer 22 serves the function of both passivation layer 11 and dielectric layer 13 of FIG. 1*b*, but does require additional deposition and patterning steps, as shown herein.

Passivation layer 22 is next patterned using conventional photolithography techniques, schematically illustrated in FIG. 2*d* by arrows 24. Note that, as discussed above with respect to FIG. 1*b*, it may not be possible to pattern passivation layer 22 with as small a critical dimension CD as the CD1 of TSV's 16. This difference in CD is not problematic, however, in the present embodiment because of portion of passivation layer 22 can remain un-patterned below the level of the top surfaces of TSV's 6, as shown in FIG. 2*d*. In this way, the lower portion of passivation layer effectively serves the same purpose as does passivation layer 11 of FIG. 1*b* while the upper portion of passivation layer 22 effectively serves the same purpose as does dielectric layer 13 of FIG. 1*b*—without the need for additional deposition and patterning steps. Note that in this same patterning step, openings in passivation layer 22 are formed to allow for subsequent electrical contacting of TSV's 6 and also for subsequent electrical contacting of TMV's 7.

Figures 2E, 3A:
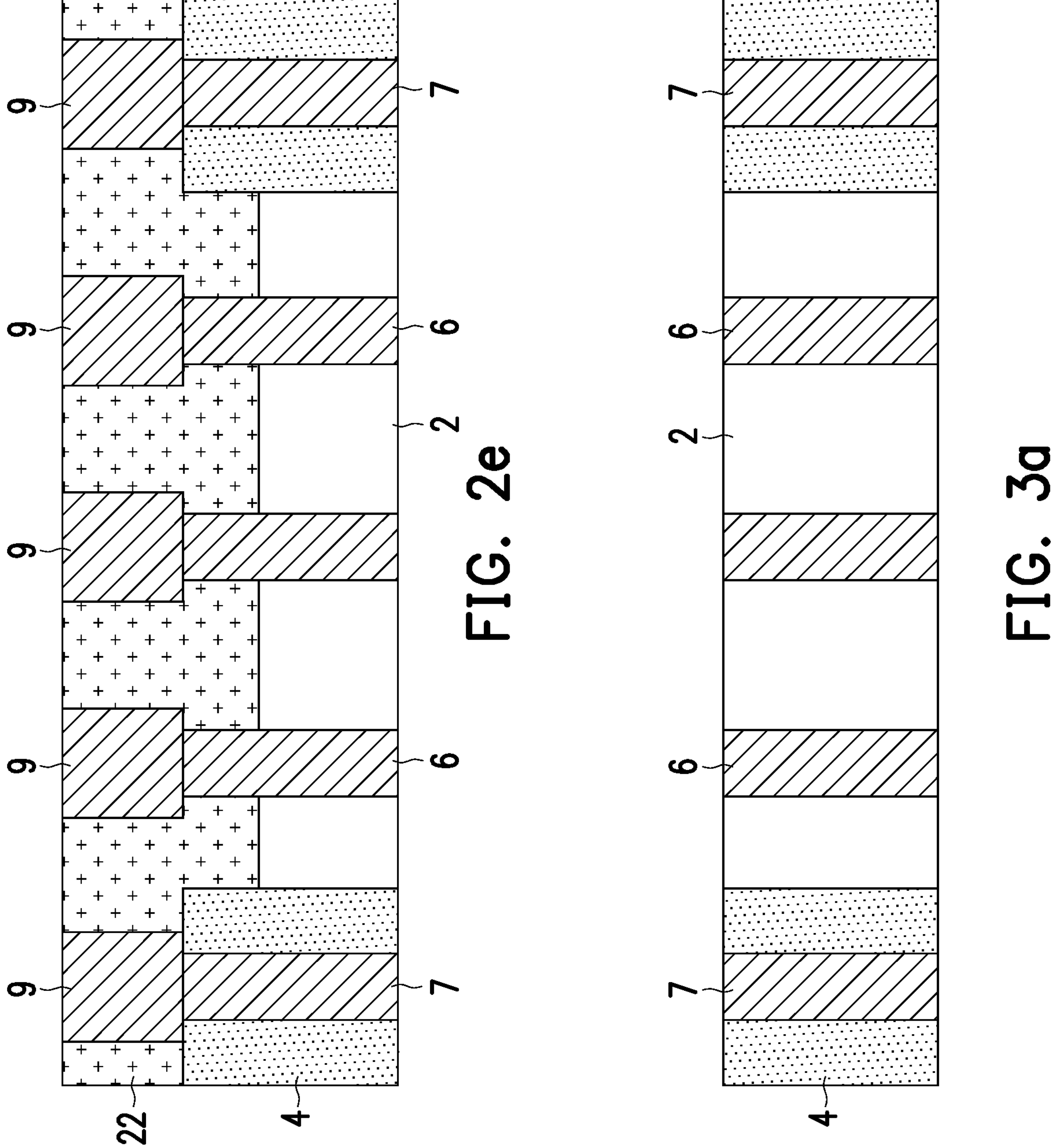
FIGS. 3*a* through 3*e* illustrate cross-sectional views of various intermediate stages of manufacture of a semiconductor package in accordance with other embodiments.

Processing continues, as illustrated in FIG. 2*e*, with the formation of contact features 9 of RDL 12 in the holes formed in patterned passivation layer 22. Contact features 9 embedded within passivation layer 22 form the first layer of the plurality of stacked conductive layers embedded within stacked dielectric layers that together form RDL 12 illustrated in FIG. 1*a*. In an embodiment, contact features 9 are formed by overfilling holes in patterned passivation layer 22 with one or more layers of conductive material, such as copper, aluminum, platinum, gold, tin, solder, and combinations and alloys thereof and then planarizing the structure to remove excess conductive material and to make the respective top surfaces of contact features 9 co-planar with the top surface of passivation layer 22. In other embodiments, contact features can be formed by electroplating or electroless plating conductive material within the holes. In such embodiments, exposed TSV's and TMV's can server as seed material upon which conductive features 9 can be plated.

Having formed conductive features 9 having a large CD relative to the underlying TSV's 6 and/or TMV's 7 without the need to form and pattern a separate or additional layer, processing can then continue using known techniques to form the remainder of RDL 12, mount integrated circuits 14 and 16, and form connectors 10 and 18, etc., the details of which processes are not necessary for understanding the present disclosure and hence are omitted herein for the sake of clarity and brevity.

Figure 3B:
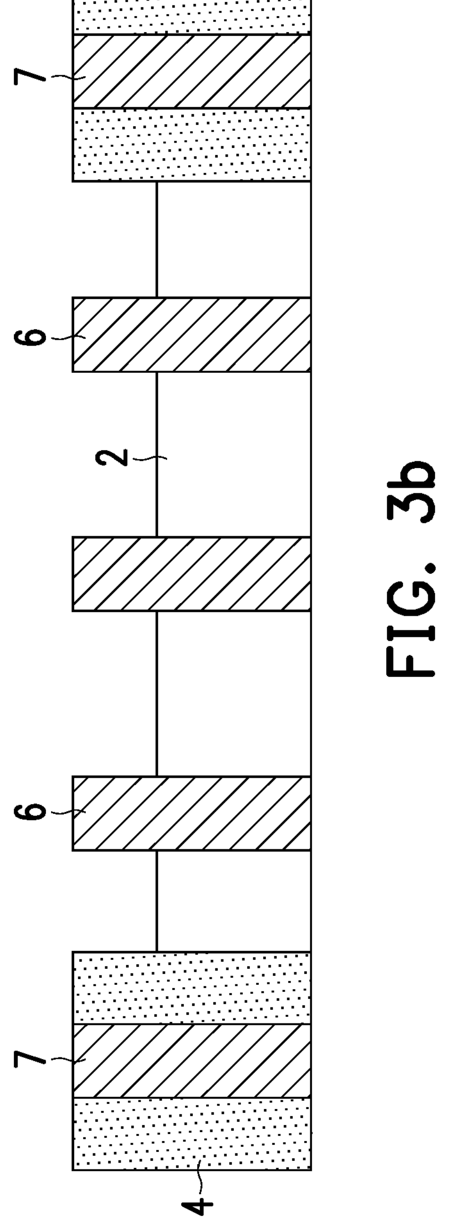
Figure 3C:
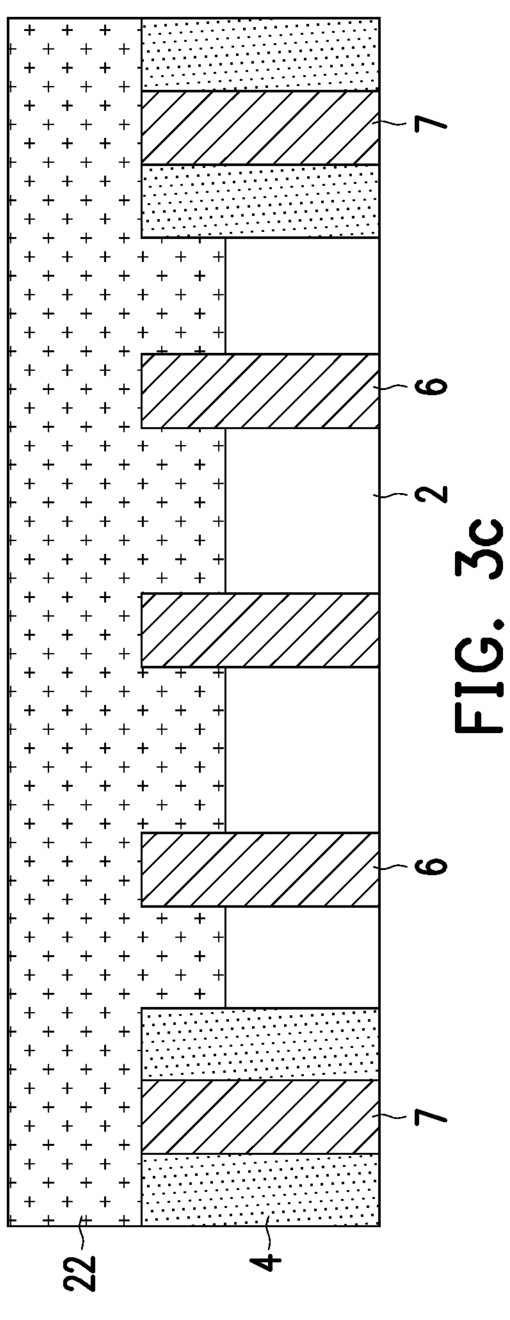

Another illustrative embodiment process for manufacturing package 100 is illustrated in FIG. 3*a* through 3*e*, in which these figures illustrate intermediate steps in the manufacture of package 100 with reference to the region illustrated by dotted line box 20 in FIG. 1*c*. The steps illustrated in FIGS. 3*a* through 3*c* match those described with regard to FIGS. 2*a* through 2*c*. Specifically, in the intermediate stage of manufacture shown in FIG. 3*a*, die 2 has been encapsulated on its four sides with molding compound 4, and TSV's 6 have been formed extending through die 2, and TMV's 7 have been formed extending through molding compound 4. Likewise, in the intermediate stage of manufactured illustrated by FIG. 3*b*, the top surface of die 2 has been recessed, leaving respective top portions of TSV's 6 extending above the recessed top surface of die 2. The processes described above with reference to FIG. 2*b* can be employed in this embodiment as well, or other techniques for recessing die 2 are also within the contemplated scope of this disclosure. Similarly, as shown in FIG. 3*c*, passivation layer 22 is formed over the intermediate structure—much as was described above with reference to FIG. 2*c*. In this embodiment, however, passivation layer 22 need not be (although it can be) a photo-sensitive material.

Figures 3D, 3E:
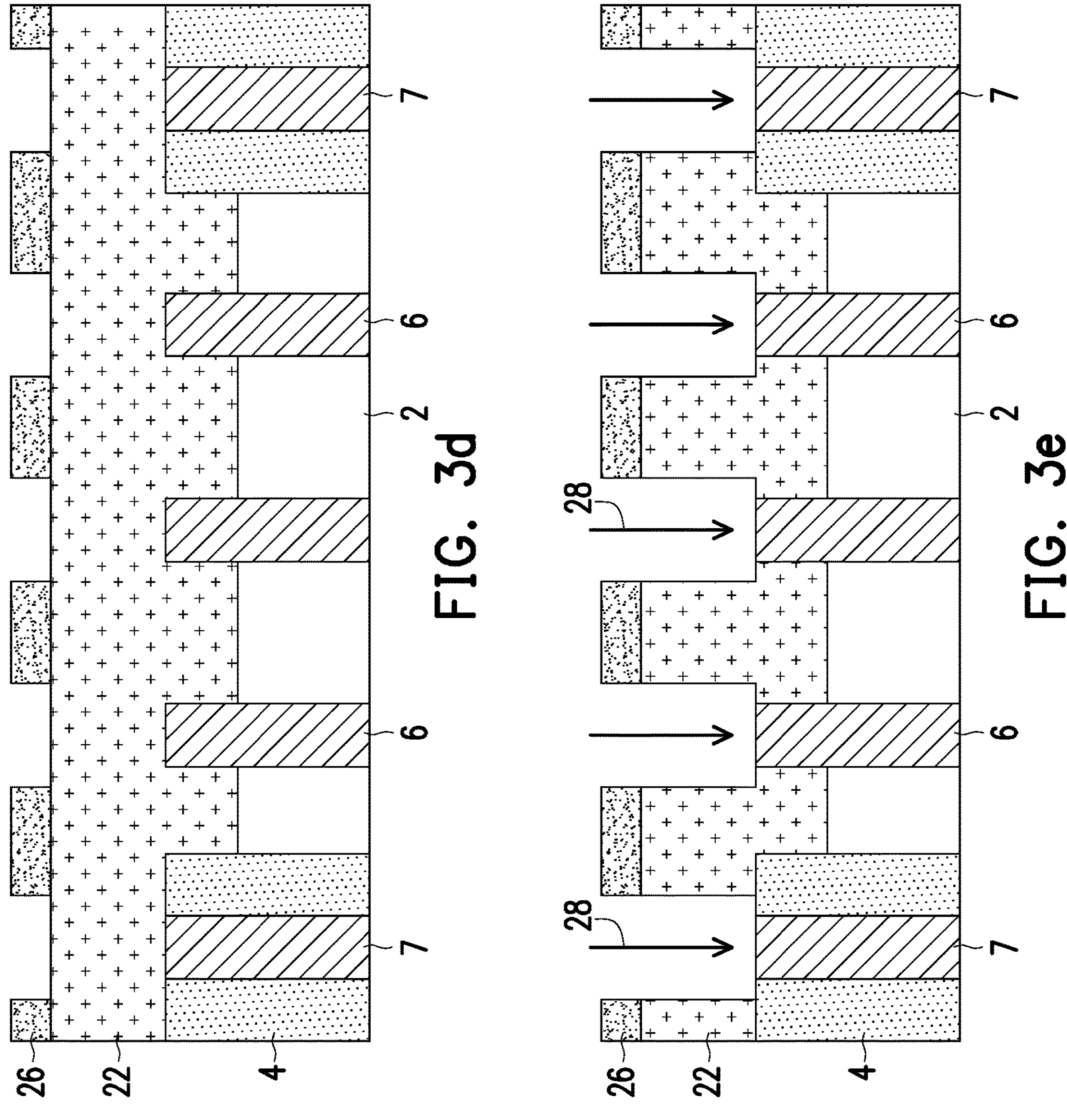

Continuing now with FIG. 3*d*, in this embodiment patterned hard mask 26 is formed atop passivation layer 22. Patterned hard mask 26 can be formed by blanket depositing a hard mask material such as, e.g., photoresist material and then patterning the hard mask material using known photolithography techniques to pattern the hard mask material—resulting in patterned hard mask 26 shown in FIG. 3*d*. Next, using patterned hard mask 26 as a protective mask, underlying passivation layer 22 is patterned using a drilling process, as schematically illustrated by arrows 28 in FIG. 3*e*. Plasma drilling or laser drilling is contemplated, as are known in the art—although other drilling techniques are within the contemplated scope of the present disclosure as well. Patterned hard mask 26 may be removed concurrently with the removal of portions of passivation layer 22 during the drilling process. In other embodiments, some or all of patterned hard mask 26 will remain atop patterned passivation layer 22 after the drilling process. In such a case, any remaining portions of hard mask 26 can be removed, e.g., ashing or the like. Alternatively, remaining portions of hard mask 26 can be left in place, assuming those remaining portions will not adversely affect subsequent processing steps or the performance of layers or feature formed atop the remaining portions of hard mask 26.

Processing continues, similarly to processing that was described above with regard to the embodiment illustrated in FIGS. 2*a* through 2*e*, with the formation of contact features 9 of RDL in the holes formed in patterned passivation layer 22. Contact features 9 embedded within passivation layer 22 form the first layer of the plurality of stacked conductive layers embedded within stacked dielectric layer that together form RDL 12 illustrated in FIG. 1*a*. In an embodiment, contact features 9 are formed by overfilling holes in patterned passivation layer 22 with one or more layers of conductive material, such as copper, aluminum, platinum, gold, tin, solder, and combinations and alloys thereof and then planarizing the structure to remove excess conductive material and to make the respective top surfaces of contact features 9 co-planar with the top surface of passivation layer 22. In other embodiments, contact features can be formed by electroplating or electroless plating conductive material within the holes. In such embodiments, exposed TSV's and TMV's can server as seed material upon which conductive features 9 can be plated. While it may be possible to form contact features 9 with a smaller CD using the embodiment illustrated in FIGS. 3*a* through 3*e*, relative to the CD possible using the embodiment illustrated in FIGS. 2*a* through 2*e*, this embodiment nonetheless provides manufacturing flexibility in accommodating contact features and TSV's having the same CD or having different CD's. Having formed conductive features 9 having a large CD relative to the underlying TSV's 6 and/or TMV's 7 without the need to form and pattern a separate or additional layer, processing can then continue using known techniques to form the remainder of RDL 12, mount integrated circuits 14 and 16, and form connectors 10 and 18, etc., the details of which processes are not necessary for understanding the present disclosure and hence are omitted herein for the sake of clarity and brevity.

Figure 4A:
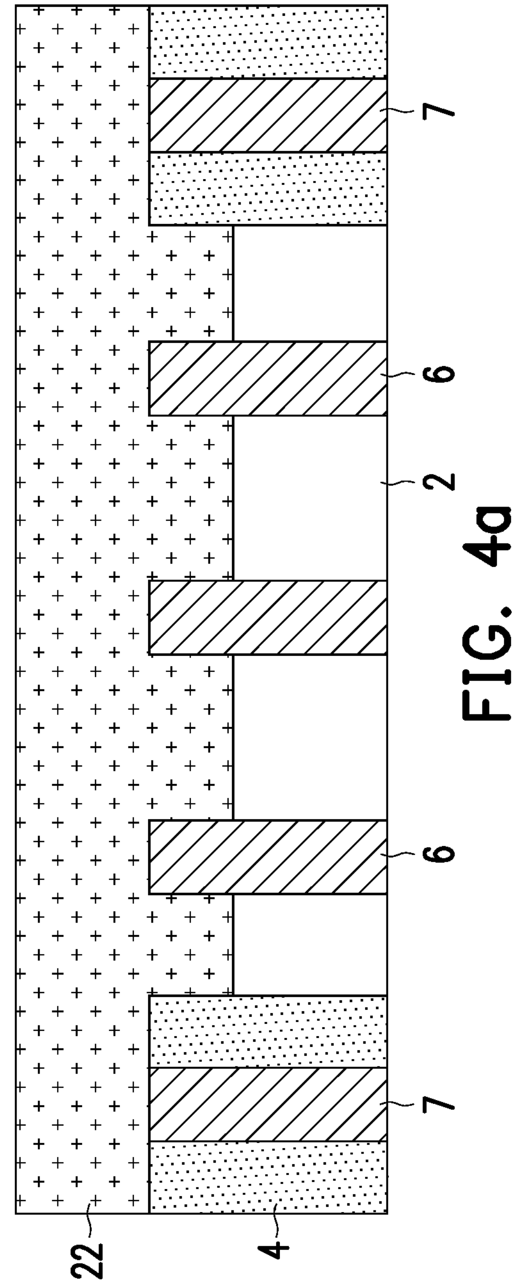
FIGS. 4*a* through 4*c* illustrate cross-sectional views of various intermediate stages of manufacture of a semiconductor package in accordance with yet additional embodiments.
Figure 4B:
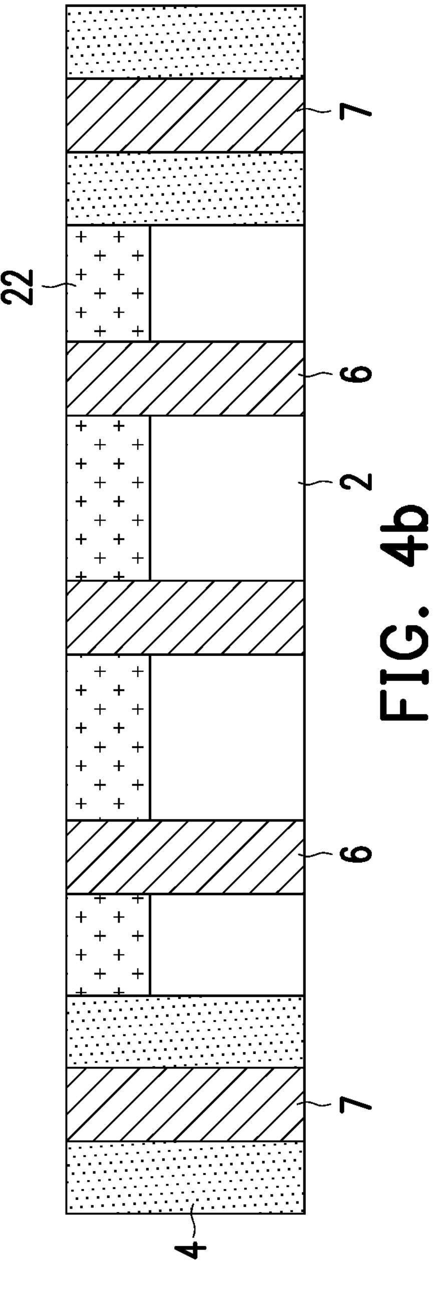
Figures 4C, 5A:
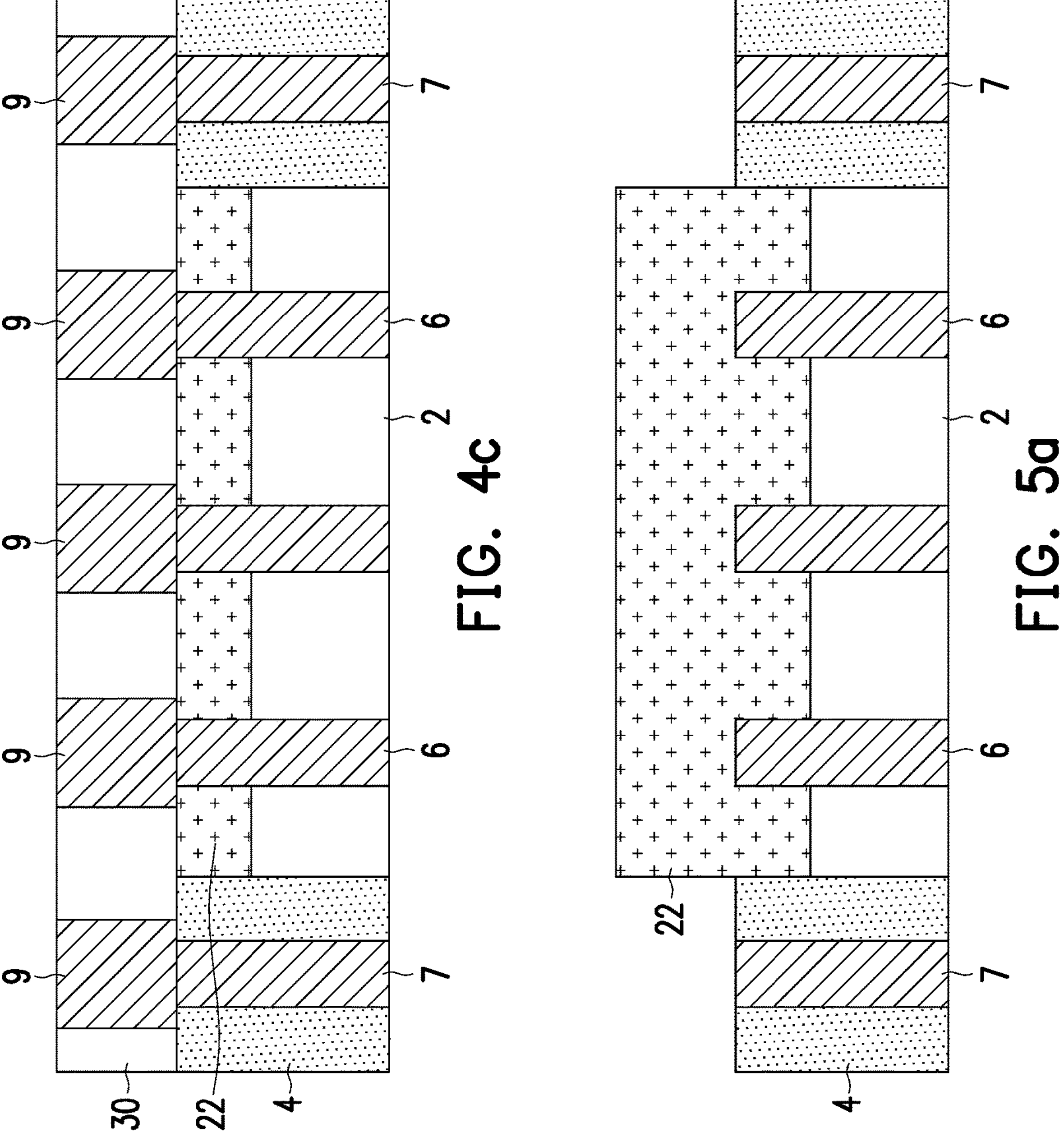
FIGS. 5*a* through 5*c* illustrate cross-sectional views of various intermediate stages of manufacture of a semiconductor package in accordance with still other embodiments.

Turning now to another embodiment, as illustrated in FIGS. 4*a* through 4*c*. FIG. 4*a* illustrates the region of exemplary package 100, illustrated in box 20 of FIG. 1*c*, in an intermediate stage of manufacture comparable to the stage illustrated in FIG. 2*c* with regard to the above-described embodiment. In other words, in the intermediate stage of manufacture illustrated in FIG. 4*a*, die 2 has been at least partially encapsulated in molding compound 4 and the top surface of die 2 has been recessed to below the level of the top surface of molding compound 4 and also of TSV's 6 which have previously been formed to extend through die 2. Likewise, in the illustrated embodiment, TMV's 7 have been formed extending through molding compound 4. Also, as shown in this stage, passivation layer 22 has been formed overlying die 2 and molding compound 4. The details of manufacture for the device illustrated in FIG. 4*a* have been provided above with regard to the previously-described embodiments, and hence will not be repeated here for the sake of brevity and clarity.

Next, a chemical mechanical polish (CMP) process is performed on passivation layer 22, the results of which are illustrated in FIG. 4*b*. In the ideal case, the top surface of passivation layer 22 is planarized to be substantially co-planar with the top surface of molding compound 4 and the respective top surfaces of TSV's 6, as illustrated. Note the CMP process is chosen to be highly selective to the material of passivation layer 22 relative to the material of molding compound 4 and the material of TSV's 6 so that those features are removed only slightly relative to the removal of the material of passivation layer 22. In the resulting structure, FIG. 4*b*, passivation layer remains only on the top surface of die 2 and between respective TSV's 6; passivation layer 22 does not remain on the top surfaces of TSV's 6 or the top surface of molding compound 4 (or the top surfaces of TMVs 7). Note that no lithography step is required, in this embodiment, in order to pattern passivation layer 22 in this manner.

Processing continues with the formation of second passivation layer 30, as shown in FIG. 4*c*. One skilled in the art will recognize the benefit of ensuring that passivation layer 22 and second passivation layer 30 are compatible materials. In an example, passivation layer 22 could be formed of a low temperature polyimide (LTPI). Alternatively, passivation layer 22 could be formed of silicon nitride material, which provides the benefit of low structural stress due to its high hardness. In either event, second passivation layer 30 could be formed of a dielectric polymer material. After formation of second passivation layer 30, which may be blanket deposited for instance, second passivation layer 30 is patterned to form openings for contact features 9 which form the first conductive layer of RDL 12 (shown in FIG. 1*c*). Patterning of second passivation layer 30 could be performed by photolithography as described above, through a drilling process as described above, or through some other technique as is known or as will become apparent to one skilled in the art once informed by the present disclosure. After formation of contact features 9, processing continues with forming (additional layers of) RDL 12, forming connectors 18 and/or 12, mounting integrated circuits 14 and 16, and the like.

Yet another embodiment will now be described with respect to FIGS. 5*a* through 5*c*. Starting with FIG. 5*a*, the region of exemplary package 100, illustrated in box 20 of FIG. 1*c*, is once again illustrated in an intermediate stage of manufacture in which die 2 has been at least partially encapsulated in molding compound 4 and the top surface of die 2 has been recessed to below the level of the top surface of molding compound 4 and also of TSV's 6 which have previously been formed to extend through die 2. Likewise, in the illustrated embodiment, TMV's 7 have been formed extending through molding compound 4. Also, as shown in this stage, passivation layer 22 has been formed overlying die 2. The details of manufacture for the device illustrated in FIG. 5*a* have been provided above with regard to the previously-described embodiments, and hence will not be repeated here for the sake of brevity and clarity.

In one embodiment shown in FIG. 5*a*, passivation layer 22 is patterned, preferably using photolithography, to remove passivation layer 22 from over the top surface of molding compound 4. In another embodiment resulting in the same intermediate structure as shown in FIG. 5*a*, a mask layer or other form of mask could be employed to prevent the deposition of passivation layer onto molding compound 4 but to allow only selective deposition of passivation layer 22 onto die 2 (and TSVs 6) only. While CMP processes are well-understood and compatible with manufacturing processes, in some applications the CMP process could create challenges with regard to warpage and total thickness variation ("TTV"). An advantageous feature of the embodiment illustrated in FIG. 5*a* is that the total surface area of passivation layer 22 to be removed in the CMP process is less than the total surface area to be removed in the embodiment illustrated in FIG. 4*a* (this is because the passivation layer extends over both die 2 and molding compound 4 in the embodiment of FIG. 4*a*, but extends only over die 2 in the embodiment of FIG. 5*a*, and hence has less surface area). Because less passivation layer 22 must be removed in the embodiment of FIG. 5*a*, less time and effort for the CMP process is involved in that embodiment, meaning that variations in TTV are less likely to occur or to be of lesser consequence. Hence, the embodiment illustrated in FIG. 5*a* might ameliorate concerns with warpage and TTV associated with other embodiments described herein.

Figures 5B, 5C:
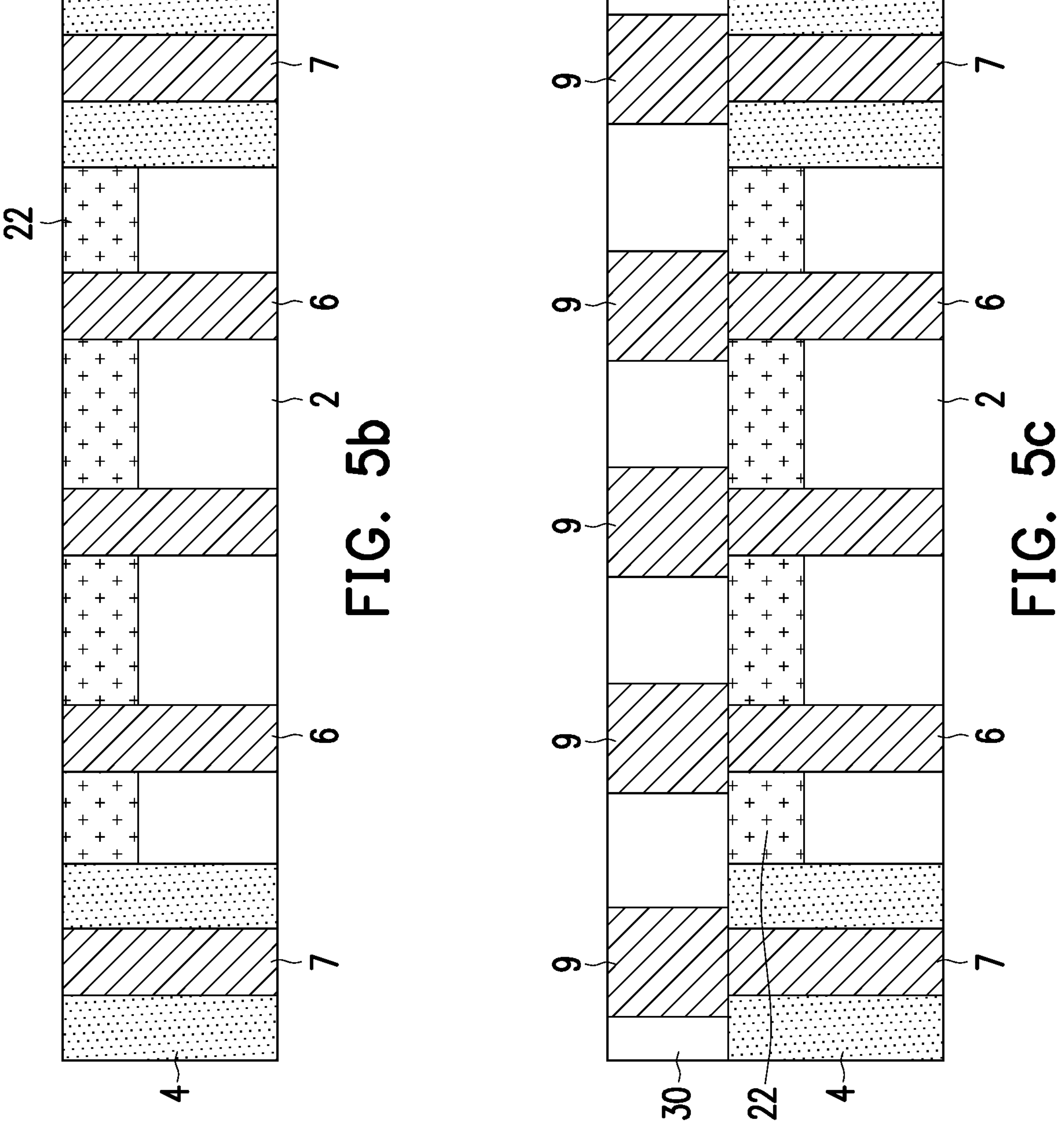

As shown in FIG. 5*b*, processing continues with a CMP step to planarize passivation layer 22 to be co-planar with respective top surface of TSV's 6. Because of the previously-described photolithography step (see FIG. 5*a*), it is not necessary to remove passivation layer 22 from atop molding compound 4 in this CMP step. The CMP process can be accomplished using conventional techniques.

Processing continues with the formation of second passivation layer 30, as shown in FIG. 5*c*. One skilled in the art will recognize the benefit of ensuring that passivation layer 22 and second passivation layer 30 are compatible materials. In an example, passivation layer 22 could be formed of a low temperature polyimide (LTPI). Alternatively, passivation layer 22 could be formed of silicon nitride material, which provides the benefit of low structural stress due to its high hardness. In either event, second passivation layer 30 could be formed of a dielectric polymer. After formation of second passivation layer 30, which may be blanket deposited for instance, second passivation layer 30 is patterned to form openings for contact features 9 which form the first conductive layer of RDL 12 (shown in FIG. 1*c*). Patterning of second passivation layer 30 could be performed by photolithography as described above, through a drilling process as described above, or through some other technique as is known or as will become apparent to one skilled in the art once informed by the present disclosure. After formation of contact features 9, processing continues with forming (additional layers of) RDL 12, forming RDL 8, if not previously formed, forming connectors 18 and/or 12, mounting integrated circuits 14 and 16, and the like.

Figure 6:
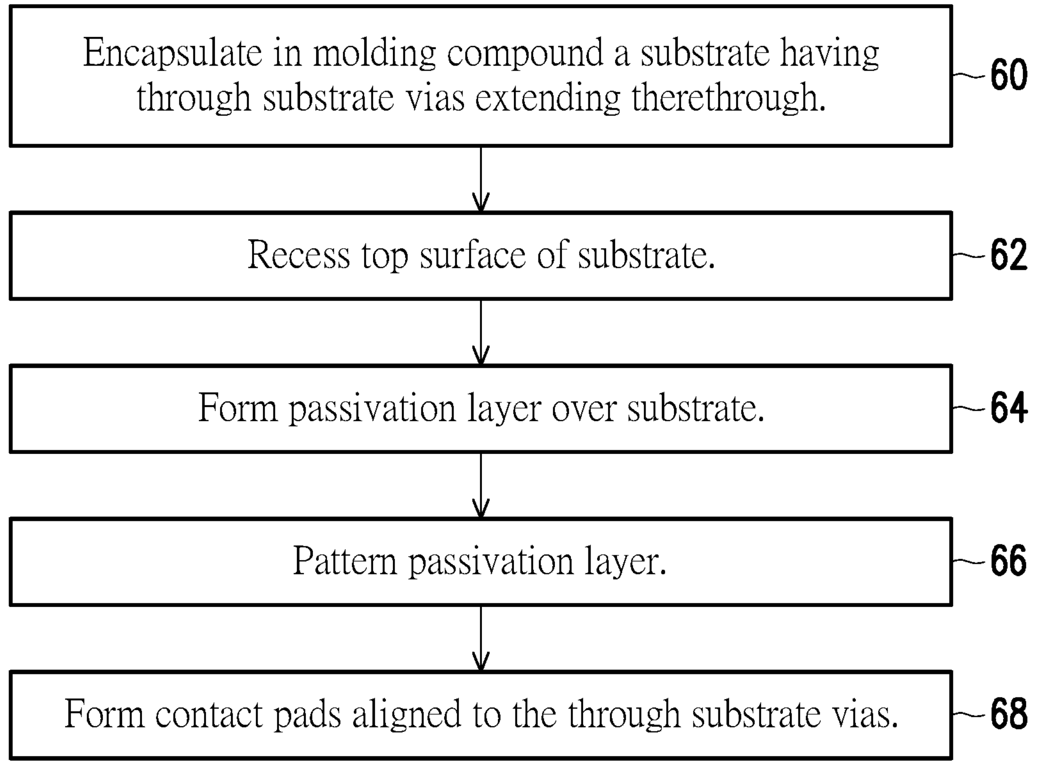
FIG. 6 provides a flow chart of major steps in illustrative methods disclosed herein.

FIG. 6 illustrates a flowchart illustrating main steps in the above described embodiments of the disclosed method for forming a packaged device. Beginning with step 60, a substrate having through silicon vias therethrough in encapsulated within a molding compound. In some embodiments, the molding compound has through vias extending therethrough as well. Next, as shown by step 62, a top surface of the substrate is recessed to that the TSV's extend above the recessed top surface. A passivation layer is then formed over the substrate and patterned, steps 64 and 66, respectively. In some embodiments, as addressed above patterning involves photolithography and/or drilling; in other embodiments, patterning involves a CMP process. Continuing on, contact pads in an RDL layer are next formed self-aligned to the TSV's, step 68. In some embodiments, the contact pads are formed within the passivation layer. In other embodiments, the contact pads are formed in a dielectric layer formed on the passivation layer.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

One general aspect of embodiments disclosed herein includes a method of forming a package device, forming a plurality of through silicon vias (TSV's) extending at least partially through a substrate. The method also includes recessing a topmost surface of the substrate below respective top surface of the respective TSV's so that the respective TSV's protrude from the topmost surface of the substrate. The method also includes forming a passivation layer on the topmost surface of the substrate. The method also includes patterning the passivation layer to expose the respective top surfaces of the respective TSV's. The method also includes forming a re-distribution layer (RDL) above the substrate, the RDL including a plurality of contact features, respective ones of the contact features being electrically and physically contacting respective ones of the plurality of TSV's.

Another general aspect of embodiments disclosed herein includes a method of forming a package device, forming through a substrate a through silicon via (TSV). The method also includes encapsulating sides of the substrate in a molding compound. The method also includes recessing a topmost surface of the substrate so that the TSV protrudes above the recessed topmost surface of the substrate. The method also includes forming a patterned passivation layer on the recessed topmost surface, where the patterned passivation layer leaves exposed a topmost surface of the TSV. The method also includes forming a re-distribution layer (RDL) above the substrate and the molding compound, the RDL having a contact pad aligned with and electrically and physically contacting the topmost surface of the TSV. The method also includes and mounting an integrated circuit on the RDL.

Yet another general aspect of embodiments disclosed herein includes a method of forming a packaged device, forming through a substrate a through silicon via (TSV) having a first minimum width when viewed in cross-section. The method also includes recessing a topmost surface of the substrate to expose a top portion of the TSV. The method also includes forming on the substrate a re-distribution layer (RDL), the RDL having a contact pad therein, the contact pad being aligned with the TSV and having a second minimum width when viewed in cross-section, the second width being greater than the first width.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a package device, the method comprising:

forming a plurality of through silicon vias (TSVs) extending at least partially through a substrate;

recessing a topmost surface of the substrate below respective top surface of the respective TSVs so that the respective TSVs protrude from the topmost surface of the substrate;

forming a photosensitive passivation layer on the topmost surface of the substrate;

patterning the photosensitive passivation layer, using a photolithography process, to expose the respective top surfaces of the respective TSVs; and forming a re-distribution layer (RDL) above the substrate, the RDL including a plurality of contact features, at least one of the contact features being electrically and physically contacting at least one of the plurality of TSVs.

2. The method of claim 1 further comprising:

at least partially encapsulating the substrate in a molding compound.

3. The method of claim 1 further comprising:

at least partially encapsulating the substrate in a molding compound by encapsulating sides of the substrate in the molding compound while leaving the topmost surface of the substrate free of the molding compound.

4. The method of claim 3 further comprising:

forming through mold vias (TMVs) in the molding compound.

5. The method of claim 1 wherein the step of patterning the photosensitive passivation layer to expose the respective top surfaces of the respective TSVs comprises: photolithographically patterning the photosensitive passivation layer to form openings, respective ones of the openings exposing respective ones of the TSV's.

6. The method of claim 1 wherein the step of patterning the passivation layer to expose the respective top surfaces of the respective TSVs comprises:

forming a patterned hard mask atop the passivation layer; and drilling a plurality of holes into the passivation layer, respective ones of the holes exposing respective ones of the plurality of TSVs.

7. The method of claim 1 wherein the step of patterning the passivation layer to expose the respective top surfaces of the respective TSVs comprises:

performing a chemical mechanical polish (CMP) process on a top surface of the passivation layer to planarize the topmost surface of the passivation layer to respective topmost surfaces of respective ones of the plurality of TSVs.

8. The method of claim 1 wherein the step of forming a re-distribution layer (RDL) above the substrate includes forming the contact features within the patterned photosensitive passivation layer.

9. The method of claim 1 wherein the step of forming a re-distribution layer (RDL) above the substrate includes forming a second passivation layer on the patterned photosensitive passivation layer and forming the contact features within the second passivation layer.

10. A method of forming a package device, the method comprising:

forming a through silicon via (TSV) through a substrate;

encapsulating sides of the substrate in a molding compound;

recessing a topmost surface of the substrate so that the TSV protrudes above the recessed topmost surface of the substrate;

forming a photosensitive passivation layer on the recessed topmost surface, and photolithographically patterning the photosensitive passivation layer to expose a topmost surface of the TSV; and forming a re-distribution layer (RDL) above the substrate and the molding compound, the RDL having a contact pad aligned with and electrically and physically contacting the topmost surface of the TSV; and mounting an integrated circuit on the RDL.

11. The method of claim 10 wherein the step of recessing a topmost surface of the substrate so that the TSV protrudes above the recessed topmost surface of the substrate includes a deep reactive ion etch process.

12. The method of claim 10 wherein the step of patterning the photosensitive passivation layer on the recessed topmost surface includes blanket depositing a photosensitive passivation layer and patterning the blanket deposited photosensitive passivation layer using a photolithographic process.

13. The method of claim 10 wherein the step of patterning the photosensitive passivation layer on the recessed topmost surface includes blanket depositing a photosensitive passivation layer and patterning the blanket deposited photosensitive passivation layer.

14. The method of claim 10 wherein the step of patterning the photosensitive passivation layer on the recessed topmost surface includes blanket depositing a photosensitive passivation layer and patterning the blanket deposited photosensitive passivation layer using both a photolithographic process and a chemical mechanical polish (CMP) process.

15. The method of claim 10 further comprising forming the contact pad in an opening in the patterned photosensitive passivation layer.

16. The method of claim 10 further comprising:

forming a second patterned passivation layer on the patterned photosensitive passivation layer; and forming the contact pad in an opening in the patterned second passivation layer.

17. The method of claim 16, wherein:

the patterned passivation layer is formed of a material selected from the group consisting of a polyimide and silicon nitride; and the second patterned passivation layer is formed of photoresist material.

18. A method of forming a packaged device, the method comprising:

encapsulating a die in a molding compound, wherein a topmost surface of the die is below a topmost surface of the molding compound;

forming a through silicon via (TSV) extending through the die, the TSV having a first minimum width when viewed in cross-section and having a top portion protruding above a topmost surface of the die;

depositing a passivation layer covering the die and covering sidewalls of the top portion of the TSV, the passivation layer extending between the TSV and a sidewall of the molding compound;

photolithographically patterning the passivation layer to expose the top portion of the TSV; and forming a re-distribution layer (RDL) on the die and the molding compound, the RDL having a contact pad therein, the contact pad being aligned with the TSV and having a second minimum width when viewed in cross-section, the second minimum width being greater than the first minimum width.

19. The method of claim 18 further comprising mounting a second die and a third die on and electrically connected to the RDL.

20. The method of claim 18, wherein the passivation layer extends over the top of the molding compound.

* * * * *